United States Patent
Fiebag et al.

(10) Patent No.: US 6,541,188 B2
(45) Date of Patent: Apr. 1, 2003

(54) DEVELOPER FOR ALKALINE-DEVELOPABLE LITHOGRAPHIC PRINTING PLATES

(75) Inventors: Ulrich Fiebag, Rosenweg (DE); Hans-Joachim Timpe, Baumhofstr (DE); Uwe Tondock, Langer Hagen (DE); Andreas Vihs, Bochstr (DE)

(73) Assignee: Kodak Polychrome Graphics LLC, Norwalk, CT (US)

( * ) Notice: Subject to any disclaimer, the term of this patent is extended or adjusted under 35 U.S.C. 154(b) by 0 days.

(21) Appl. No.: 09/853,358

(22) Filed: May 11, 2001

(65) Prior Publication Data

US 2003/0036024 A1 Feb. 20, 2003

(51) Int. Cl.$^7$ .................................................. G03F 7/32
(52) U.S. Cl. ........................................ 430/331; 430/486
(58) Field of Search ................................ 430/331, 486

(56) References Cited

U.S. PATENT DOCUMENTS

| | | | |
|---|---|---|---|
| 3,664,933 A | * 5/1972 | Clauss | 204/40 |
| 4,711,836 A | 12/1987 | Ferreira | 430/326 |
| 5,141,838 A | 8/1992 | Aishima et al. | 430/191 |
| 5,837,425 A | 11/1998 | Nakanishi et al. | 430/302 |
| 5,851,735 A | 12/1998 | Miller et al. | 430/322 |
| 6,114,089 A | 9/2000 | Takita et al. | 430/278 |
| 6,143,479 A | 11/2000 | Fiebag et al. | 430/331 |

FOREIGN PATENT DOCUMENTS

| | | |
|---|---|---|
| EP | 0 716 347 | 6/1996 |
| EP | 1 081 554 | 3/2001 |
| GB | 2 276 729 | 10/1994 |
| JP | 05094024 | 4/1993 |
| JP | 05163595 | * 6/1993 |
| JP | 11167207 | 6/1999 |
| JP | 00089474 | 3/2000 |

OTHER PUBLICATIONS

Material Safety Data Sheet, MSDS ID: 5314FF, 55815290 LH–DPW2 Thermal Positive Plate Dev., Fuji Photo Film USA, Inc., Jun. 7, 2001.

Material Safety Data Sheet, MSDS ID: 5315FF, 55815300 LH–DPR2 Thermal Positive Plate Fuji Photo Film USA, Inc., Jun. 7, 2001.

* cited by examiner

Primary Examiner—Hoa Van Le
(74) Attorney, Agent, or Firm—RatnerPrestia

(57) ABSTRACT

An aqueous alkaline developing system for alkaline-developable lithographic printing plates and a method for its use are disclosed. The developing system comprises one or more water-soluble suppressors of the following structure:

$$R_1(CHOH)_nR_2$$

in which:

n is 4 to 7; and either (i) $R_1$ is hydrogen, aryl, or $CH_2OH$; and $R_2$ is alkyl group having 1 to 4 carbon atoms, $CH_2OR_3$ in which $R_3$ is an alkyl group having 1 to 4 carbon atoms, $CH_2N(R_4R_5)$ in which $R_4$ and $R_5$ are each independently hydrogen or an alkyl group having 1 to 4 carbon atoms, or $CO_2H$; or (ii) $R_1$ and $R_2$ together form a carbon-carbon single bond. The developing system is especially suited for developing imageable elements useful as lithographic printing plates. The developing system is especially suited for use with elements in which (1) the imageable layer comprises at least one phenolic resin or at least one polymeric compound having pendent sulfonamide groups, and (2) the substrate is aluminum or and an aluminum alloy.

34 Claims, No Drawings

DEVELOPER FOR ALKALINE-DEVELOPABLE LITHOGRAPHIC PRINTING PLATES

FIELD OF THE INVENTION

This invention relates to lithographic printing. In particular, this invention relates to a developing system for both positive-working and negative-working imageable elements useful as alkaline-developable lithographic printing plates and to a method for its use.

BACKGROUND OF THE INVENTION

In lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. The ink is transferred to the surface of a material upon which the image is to be reproduced. Typically, the ink is first transferred to an intermediate blanket, which in turn transfers the ink to the surface of the material upon which the image is to be reproduced.

Imageable elements useful as lithographic printing plates, sometimes called printing plate precursors or printing forms, typically comprise an imageable layer applied over the surface of a hydrophilic substrate. The imageable layer includes one or more radiation-sensitive components, which may be dispersed in a suitable binder. Alternatively, the radiation-sensitive component can also be the binder material.

To obtain a printing plate with imagewise distribution of printable regions, it is necessary to remove regions of an imaged imageable element. The most common method for removing the undesired regions is to contact the imaged element with a developer. If after exposure to radiation the exposed regions of the layer are removed by the developer revealing the underlying hydrophilic surface of the substrate, the element is a positive-working printing element. Conversely, if the unexposed regions are removed, the element is a negative-working element. In each instance, the regions of the imageable layer (i.e., the image areas) that remain after development are ink-receptive, and the regions of the hydrophilic surface revealed by the developing process accept water and aqueous solutions, typically a fountain solution, and repel ink.

Many alkaline-developable positive-working imageable elements comprise a light sensitive layer comprising a phenolic resin, such as a novolac resin, on a hydrophilic substrate, typically a specially treated aluminum sheet. In one type of element, for example, the light sensitive layer comprises a novolac resin and a radiation-sensitive o-diazoquinone or diazonaphthoquinone compound, such as a naphthoquinonediazide sulfonic acid ester of a novolac resin. Upon exposure to light, the radiation-sensitive diazonaphthoquinone is converted to the corresponding carboxylic acid. The developer penetrates and removes the exposed, or image regions of the imageable layer, revealing the underlying hydrophilic surface of the substrate, without substantially affecting the complimentary unexposed regions.

Certain negative-working printing plates contain novolac resins, a cross-linking agent, and a radiation-sensitive component that produces acid on exposure. Subsequent heating cures the exposed regions, so that only the unexposed areas can be removed by an alkaline developer. The exposed regions, which remain after development, are oleophilic and will accept ink.

In both types of printing plates, an alkaline developer can attack the imageable layer, front side (aluminum oxide) and/or the backside (aluminum) of the imageable element. Developers for imageable elements that contain phenolic or similar resins typically comprise components that suppress the attack of the high alkaline developer either on the substrate or on the imageable layer. Often there are problems of miscibility of these components in the alkaline developer. Typically, silicate solutions (either as meta silicate or water glass) are used to protect aluminum substrates. In practice, this leads to problems caused by silicate deposits on developed plates.

In addition, the activity of developers based on metasilicates cannot be monitored by conductivity measurements. Therefore, a top-up mode is required leading to a high volume of wasted developer. In this mode, only the developer is used to keep the activity of the developer in the developing section of a processor constant. This requires about 150 to 250 mL of developer per square meter of plate treated, from which about 100 to 200 mL are removed by an overflow device of the processor.

Therefore, a need exists for a developing system that protects the substrate from attack by an alkaline developer, that does not cause undesirable deposits on the developed printing plate, that requires only a small number of components, and whose activity can be monitored by conductivity measurements.

SUMMARY OF THE INVENTION

The invention is a developing system for both positive-working and negative-working imageable elements useful as lithographic printing plates. The developing system comprises both a developer and a replenisher.

The developer comprises an aqueous alkaline solution of one of more water-soluble suppressors of the following structure:

$R_1(CHOH)_nR_2$ in which n is 4 to 7; and
either (i) $R_1$ is hydrogen, aryl, or $CH_2OH$; and $R_2$ is alkyl group having 1 to 4 carbon atoms, $CH_2OR_3$ in which $R_3$ is an alkyl group having 1 to 4 carbon atoms, $CH_2N(R_4R_5)$ in which $R_4$ and $R_5$ are each independently hydrogen or an alkyl group having 1 to 4 carbon atoms, or $CO_2H$; or (ii) $R_1$ and $R_2$ together form a carbon-carbon single bond. These suppressors prevent attack by the alkaline developer on both the image and on the aluminum substrate.

The aqueous alkaline solution has a pH of about 10.0, typically greater than about 11.0, to about 14.0; and the one or more suppressors together comprise about 10 wt % to about 30 wt % of the developer.

Although the developer may be used as its own replenisher, typically a specially formulated replenisher, which comprises all the ingredients of the developer but which has a higher concentration of base is used as the replenisher.

preferred positive-working imageable element for use with the developing system of the invention comprises an aluminum substrate and an imageable layer that comprises a phenolic resin, preferably a novolac resin. Preferred suppressors include N-methyl-glucamin, meso-inosit, gulonic acid gamma-lactone, and mixtures thereof.

In another aspect, the invention is a method for forming an image using the developing system. In another aspect, the invention is an image formed by the method of the invention.

DETAILED DESCRIPTION OF THE INVENTION

Developing System

Attack both on the imageable layer and on an aluminum or aluminum alloy substrate by a developer having a pH of greater than about 10 can be suppressed by water-soluble organic compounds, or suppressors, having the following structure:

$$R^1(CHOH)_n R^2$$

in which n is 4 to 7; and
either (i) $R^1$ is H, aryl, or $CH_2OH$; and $R^2$ is alkyl group having 1 to 4 carbon atoms, $CH_2OR^3$ in which $R^3$ is an alkyl group having 1 to 4 carbon atoms, $CH_2N(R^4R^5)$ in which $R^4$ and $R^5$ are each independently H or an alkyl group having 1 to 4 carbon atoms, or $CO_2H$; or
(ii) $R^1$ and $R^2$ together form a carbon-carbon single bond.

Either a single suppressor or a mixture of suppressors may be used. The suppressor or the mixture of suppressors comprises about 10 wt % to about 30 wt % of the developer.

In one group of suppressors, $R^1$ and $R^2$ together form a carbon-carbon single bond. Included are carbocyclic compounds of the structure: $(CHOH)_n$, in which n is 4 to 7. In a preferred group of suppressors, n is 5 or 6, more preferably 6. There are nine possible stereoisomers of 1,2,3,4,5,6-hexahydroxycyclohexane, several of which are naturally occurring. A preferred suppressor is meso-inosit (cis-1,2,3, 5-trans-4,6-hexahydroxycyclohexane). meso-Inosit can be isolated from corn steep liquor.

In another group of suppressors, $R^1$ is H, aryl, or $CH_2OH$; and $R^2$ is alkyl group having 1 to 4 carbon atoms, $CH_2OR^3$ in which $R^3$ is an alkyl group having 1 to 4 carbon atoms, $CH_2N(R^4R^5)$ in which $R^4$ and $R^5$ are each independently H or an alkyl group having 1 to 4 carbon atoms, or $CO_2H$.

In one preferred group of suppressors, $R^1$ is H or $CH_2OH$; and R is $CO_2H$. More preferably, $R^1$ is H and n is 4 or 5. This group includes suppressors of the structure $H(CHOH)_n CO_2H$, in which n is 4 or 5. Conceptually, these suppressors may be produced by oxidation of the aldehyde of the corresponding hexose or pentose sugar, i.e., oxidation of the aldehyde of a hexose sugar such as glucose, fructose, galactose, allose, mannose, etc, or oxidation of the aldehyde of a pentose sugar such as arabinose, ribose, xylose, etc. Gluconic acid $[H(CHOH)_5CO_2H]$, for example, may be prepared by oxidation of glucose by, for example, microbiological oxidation. Preferred suppressors include ribonic acid, gluconic acid (dextronic acid), mannonic acid, and gulonic acid.

As is known to those skilled in the art, these suppressors may exit in a ring-closed lactone form. Ribonic acid may exist as ribonic acid gamma-lactone. Gluconic acid may exist as gluconic acid gamma-lactone. Mannonic acid may exist as mannonic acid gamma-lactone. Gulonic acid may exist as gulonic acid gamma-lactone. The lactone form of these suppressors is included is the definition given above.

Also, as it apparent to those skilled in the art, in alkaline solution the suppressor may exist as an anion $[H(CHOH)_n CO_2]$ due to ionization of the carboxyl group ($CO_2H$) to the carboxylate anion ($COO^-$). Lactose are converted to salts of the corresponding ring-opened acids in alkaline solution. Or the compound may be supplied as a salt, especially as an alkali metal salt, such as a sodium salt $[H(CHOH)_n CO_2^- Na^+]$, or a potassium salt $[H(CHOH)_n CO_2^- K^+]$. Anions and salts of these suppressors are included in the definition given above.

In another group of suppressors, $R^1$ is hydrogen, and $R^2$ is $CH_2N(R^4R^5)$ in which $R^4$ and $R^5$ are each independently hydrogen or an alkyl group having 1 to 4 carbon atoms. n is preferably 4 or 5, and $R^4$ and $R^5$ are preferably each independently hydrogen or an alkyl group having 1 to 2 carbon atoms. Preferred suppressors include glucamine, N-methyl-glucamine, and 1-desoxy-1-(methylamino)-galactit. A more preferred suppressor is N-methyl-glucamine.

The developer has a pH between about 10 and about 14.0, typically at least about 11, preferably at least about 12, and preferably less than about 13.5. The alkalinity of the developer can be achieved by any of the conventional alkaline systems; e.g. alkali metal hydroxides, silicates, phosphates, borates, amines etc. Alkali metal hydroxides are preferred. Silicates are not favored because silicate deposits can be formed on the exposed and developed image. Consequently, the developer preferably does not comprise a silicate.

The developer may additionally comprise materials that are conventional components of developers, such as, surfactants (wetting agents), biocides (antimicrobial and/or antifungal agents), antifoaming agents, such as certain silicones, buffers, chelating (complexing) agents, etc, in a suitable amount (for example up to 5 wt % based on the total composition weight). If the developer is used in combination with and/or diluted with hard water, the presence of a chelating agent is preferred. Salts of ethylenediamine tetraacetic acid, for example, can be used as both a buffer and a chelating agent.

The developer may be a wholly aqueous developer, i.e., one that do not comprise an organic solvent, or it may comprise a small amount of one or more organic solvents, such as are disclosed in Fiebag, U.S. Pat. No. 6,143,479, incorporated herein by reference. Polyglycol derivatives with the structure:

$$R^6O-(CH_2CHR^7O)_y-R^8$$

in which $R^6$ is hydrogen or $C_1-C_8$ alkyl; $R^7$ is hydrogen, methyl or ethyl; $R^8$ is hydrogen or $CH_2COOH$; and y is an integer from 10 to 20, may be included. Polycondensation products of $C_2-C_4$ alkylene oxides with ethylene diamine may also be included. Mixture of polyglycol derivatives may also be used. Preferred polyglycol derivatives are polypropylene glycol ether, polyethylene glycol ether, polybutylene glycol ether, derivatives thereof, and mixtures thereof.

Glycols with the structure:

$$R^9-CH(OH)-(CH_2)_z-CH(OH)-R^{10}$$

in which z is 0, 1, or 2; and $R^9$ and $R^{10}$ are each independently hydrogen or $C_1-C_3$ alkyl, may be included. Preferred glycols are ethylene glycol, 1,2-propanediol, 1,3-propanediol, 1,2-butanediol, and mixtures thereof.

When present, the total amount of polyglycol derivative or derivatives present typically comprises about 0.0005 wt % to about 3 wt % of the developer, based on the total weight of the developer. When present, the total amount of glycol pr glycols present typically comprises about 3 wt % to about 8 wt % of the developer, based on the total weight of the developer.

The developer may be conveniently prepared by dissolving the components in water. It can be supplied in a form ready for use, or it can also be provided in the form of a concentrate, which is diluted with water by the user prior to use.

Although the developer can also be used as its own replenisher, preferably, a specially formulated replenisher is used. In the replenisher, the concentration of base is higher than the concentration of base in the developer to compensate for the base consumed in the development process. Thus, a balance between developer drag-out and developer feed-in is reached. There is a correlation between the value of the electric conductivity and the alkalinity of the total developer bath.

The replenisher comprises the same components as the developer. The only difference is that the electrical conductivity of the replenisher has to be higher than that of the corresponding developer (i.e., the conductivity of the developer is lower than that of the corresponding replenisher). This is can, for instance, be obtained by having a higher concentration of the alkali metal hydroxide in the replenisher. The replenisher typically has a pH of about 11.0 to about 14.

As soon as a reduction of developer efficiency is detected by a lower electrical conductivity in the developing bath, replenisher is added to the developer until the electrical conductivity of the developer reaches its original value. The developer preferably has a conductivity of about 40 to about 80 mS/cm at 20° C. The conductivity of the replenisher is higher than that of the developer, typically from about 60 to about 120 mS/cm at 20° C.

Imageable Elements

The imageable element comprises an imageable layer on a hydrophilic substrate.

Substrate

The hydrophilic substrate, i.e., the substrate that comprises at least one hydrophilic surface, comprises a support, which may be any material conventionally used to prepare imageable elements useful as lithographic printing plates. The support is preferably strong, stable and flexible. It should resist dimensional change under conditions of use so that color records will register in a full-color image. Typically, it can be any self-supporting material, including, for example, polymeric films such as polyethylene terephthalate film, ceramics, metals, or stiff papers, or a lamination of any of these materials. Metal supports include aluminum, zinc, titanium, and alloys thereof.

Although the developers may be used with imageable elements that comprise any type of substrate known in the art, they are particularly well adapted for use with those that comprise an aluminum or an aluminum alloy support. The surface of the aluminum support may be treated by techniques known in the art, including physical graining, electrochemical graining, chemical graining, and anodizing. The substrate should be of sufficient thickness to sustain the wear from printing and be thin enough to wrap around a printing form, typically from about 100 to about 600 $\mu$m.

Typically, the substrate comprises an interayer between the aluminum support and the imageable layer. The interlayer may be formed by treatment of the support with, for example, silicate, dextrine, hexafluorosilicic acid, phosphate/fluoride, polyvinyl phosphonic acid (PVPA) or polyvinyl phosphonic acid copolymers.

Imageable Layer

The imageable layer comprises either a positive-working or a negative-working imageable composition. The composition may be sensitive to ultraviolet and/or visible radiation (i.e., photoimageable), and/or it may be thermally imageable.

Positive-working photoimageable compositions are well known. They are discussed, for example, in Chapter 5 of *Photoreactive Polymers: the Science and Technology of Resists*, A. Reiser, Wiley, New York, 1989, pp. 178–225. These compositions comprise a water insoluble, alkali soluble binder and a material that comprises a photosensitive moiety. The photosensitive moiety may be bonded to the binder and/or be present in a separate compound.

The binder may comprise a phenolic resin, such as a novolac resin. Novolac resins are commercially available and are well known. They are typically prepared by the condensation reaction of a phenol, such as phenol, m-cresol, o-cresol, p-cresol, etc, with an aldehyde, such as formaldehyde, paraformaldehyde, acetaldehyde, etc. or ketone, such as acetone, in the presence of an acid catalyst. The weight average molecular weight is typically about 1,000 to 15,000. Typical novolac resins include, for example, phenol-formaldehyde resins, cresol-formaldehyde resins, phenol-cresol-formaldehyde resins, p-t-butylphenol-formaldehyde resins, and pyrogallol-acetone resins. Particularly useful novolac resins are prepared by reacting m-cresol, mixtures of m-cresol and p-cresol, or phenol with formaldehyde using conventional conditions.

Other phenolic resins include polyvinyl compounds having phenolic hydroxyl groups. Such compounds include, for example, resole resins, polymers of hydroxy-styrene (vinyl phenol), such as poly(p-hydroxystyrene); copolymers containing recurring units of hydroxystyrene; and polymers and copolymers containing recurring units of substituted hydroxystyrenes, such as acrylate and methacrylate copolymers of hydroxystyrene.

The binder may also be a water insoluble, base soluble polymeric compound having pendent sulfonamide groups, such as is described in Aoshima, U.S. Pat. No. 5,141,838 (EP 330,239). Particularly useful polymeric materials comprise (1) a sulfonamide monomer unit, especially N-(p-aminosulfonylphenyl)methacrylamide, N-(m-aminosulfonylphenyl)methacrylamide N-(o-aminosulfonylphenyl)methacrylamide, and/or the corresponding acrylamide, more especially N-(p-aminosulfonylphenyl)methacrylamide; (2) acrylonitrile and/or methacrylonitrile; and (3) methyl methacrylate and/or methyl acrylate.

The photosensitive moiety is typically the o-diazonaphthoquinone moiety. Compounds that contain the odiazonaphthoquinone moiety (i.e., quinonediazides), preferably compounds that comprise an o-diazonaphthoquinone moiety attached to a ballasting moiety that has a molecular weight of at least 1500, but less than about 5000, are preferred. Typically, these compounds are prepared by the reaction of a 1,2-naphthoquinone diazide having a halogenosulfonyl group, typically a sulfonylchloride group, at the 4- or 5-position with a mono- or poly-hydroxyphenyl compound, such as mono- or poly-hydroxy benzophenone.

The phenolic resin may be derivatized with an o-diazonaphthoquinone moiety. Polymeric diazonaphthoquinone compounds include derivatized resins formed by the reaction of a reactive derivative that contains diazonaphthoquinone moiety and a polymeric material that contains a suitable reactive group, such as a hydroxyl or amino group. Suitable polymeric materials for forming these derivatized resins include the novolac resins, resole resins, polyvinyl phenols, acrylate and methacrylate copolymers of hydroxy-containing monomers such as hydroxystyrene. Representative reactive derivatives include sulfonic and carboxylic acid, ester, or amide derivatives of the diazonaphthoquinone moiety. Derivatization of phenolic resins with compounds that contain the diazonaphthoquinone moiety is well known in the art and is described, for example, in West, U.S. Pat. Nos. 5,705,308, and 5,705,322.

A mixture comprising one or more phenolic resins and/or one or more polymeric-compounds having pendent sulfonamide groups may also be used as the binder in the positive-working photosensitive compositions.

Positive-working thermally imageable layers comprise a binder, a dissolution suppressor, and optionally, a photothermal conversion material. Such systems are disclosed in, for example, Parsons, WO 97/39894; Nagasaka, EP 0 823 327; Miyake, EP 0 909 627; West, WO 98/42507; and Nguyen, WO 99/11458, all of which are incorporated herein by reference. The binder is typically a phenolic resin, such as a novolac resin, as discussed above. The dissolution suppressors are believed not to be sensitive, i.e. photoreactive, themselves to radiation in the range of about 600 nm to about 800 nm and radiation in the range of about 800 nm to about 1200 nm, the radiation typically used to image a thermally imageable element.

The dissolution suppressor may be a compound that comprises an o-diazo-naphthoquinone moiety, such as is discussed above. The derivatized resins that comprise an o-diazonaphthoquinone moiety can act as both the binder and the dissolution suppressor. They can be used alone, or they can be combined with other binders and/or dissolution suppressors. Other compounds useful as dissolution suppressors include, compounds that contain a positively charged (i.e., quaternized) nitrogen atom, for example, tetraalkyl ammonium compounds, quinolinium compounds, benzothiazolium compounds, pyridinium compounds, and imidazolium compounds. A preferred group of dissolution suppressor compounds includes those that are also dyes, especially triarylmethane dyes such as ethyl violet. These compounds can also act as contrast or coloration dyes, which distinguishes the unimaged regions from the imaged regions in the developed imageable element.

Alternatively, or additionally, the binder itself can comprise polar groups that act as acceptor sites for hydrogen bonding with the hydroxy groups present in the polymeric material and, thus, act as a dissolution suppressor. Using well-known methods, a portion of the hydroxyl groups of the binder can be derivatized to introduce polar groups, for example carboxylic acid esters, such as benzoate esters; phosphate esters; ethers, such as phenyl ethers; and sulfonic acid esters, such as methyl sulfonates, phenyl sulfonates, p-toluene sulfonates (tosylates), and p-bromophenyl sulfonates (brosylates).

Derivatization of the hydroxyl groups of the binder increases its molecular weight and reduces the number of hydroxyl groups, typically reducing both its solubility and rate of dissolution in the developer. Although it is important that the level of derivatization be high enough that the binder also acts as a dissolution suppressor, it should not be so high that, following thermal imaging the binder is not soluble in the developer. Although the degree of derivatization required will depend on the nature of the binder and the nature of the moiety containing the polar groups introduced into the binder, typically about 0.5 mol % to about 5 mol%, preferably about 1 mol % to about 3 mol %, of the hydroxyl groups will be derivatized. These derivatized binders can be used either alone or in combination with other polymeric materials and/or dissolution suppressors.

One preferred group of binders that comprise polar groups and function as dissolution suppressors are derivatized phenolic polymeric materials in which a portion of the phenolic hydroxyl groups have been converted to sulfonic acid esters, preferably phenyl sulfonates or p-toluene sulfonates. Derivatization can be carried by reaction of the polymeric material with, for example a sulfonyl chloride such as p-toluene sulfonyl chloride, in the presence of a base such as a tertiary amine. A preferred derivatized binder is a derivatized novolac resin in which about 1 mol % to 3 mol %, preferably about 1.5 mol % to about 2.5 mol %, of the hydroxyl groups have been converted to phenyl sulfonate or p-toluene sulfonate (tosyl) groups.

When a photothermal conversion material is present, it may comprise infrared absorber or dye bound to a phenolic material (i.e., a phenolic material derivatized with an infrared absorber or infrared absorbing dye). If an appropriate infrared absorber or dye is selected, the derivatized polymeric material can act as the binder, the dissolution suppressor, and/or the photothermal conversion material.

The imageable layer may also comprise dye to aid in the visual inspection of the exposed and/or developed element. Printout dyes are added to distinguish the exposed regions from the unexposed regions before and during processing. Contrast or coloration dyes are added to distinguish the unimaged regions from the imaged regions in the developed element.

If the imageable element is to be imaged with infrared or near infrared radiation, the imageable layer absorbs the imaging radiation, preferably radiation in the range of about 800 nm to 1200 nm, the radiation is commonly used for imaging thermally imageable elements. An absorber called a photothermal conversion material, which absorb radiation and convert it to heat, is typically present in the imageable layer. Photothermal conversion materials may absorb ultraviolet, visible, and/or infrared radiation and convert it to heat. Although the binder may itself comprise an absorbing moiety, i.e., be a photothermal conversion material, typically the photothermal conversion material is a separate compound.

The photothermal conversion material may be either a dye or pigment, such as a dye or pigment of the squarylium, cyanine, merocyanine, indolizine, pyrylium, or metal diothiolene class. Examples of absorbing pigments are Projet 900, Projet 860, and Projet 830 (all available from the Zeneca Corp.). Carbon black pigments may also be used. Because of their wide absorption bands, carbon black-based plates can be used with multiple infrared imaging devices having a wide range of peak emission wavelengths.

Dyes, especially dyes that are soluble in the aqueous alkaline developer, are preferred to prevent sludging of the developer by insoluble material. The dye may be, for example, an indoaniline dye, oxonol dye, porphyrin derivatives, anthraquinone dye, merostyryl dye, pyrylium compound, or a squarylium derivative. Absorbing dyes are disclosed in numerous disclosures and patent applications in the field, for example, Nagasaka, EP 0,823,327; Van Damme, EP 0,908,397; DeBoer, U.S. Pat. No. 4,973,572; Jandrue, U.S. Pat. No. 5,244,771; and Chapman, U.S. Pat. No. 5,401,618.

The amount of photothermal conversion material in the imageable layer is generally sufficient to provide an optical density of at least 0.05, and preferably, an optical density of from about 0.5 to about 2 at the imaging wavelength.

In another embodiment of this invention, a negative-working, alkaline developable printing plate, typically one containing a novolac resin and/or another phenolic resin, is imagewise exposed with a suitable light source and heated to harden the exposed regions. These materials are described, for example, in Haley, U.S. Pat. No. 5,372,907; Haley U.S. Pat. No. 5,466,557; and Nguyen, U.S. Pat. No. 5,919,601.

Haley '907 discloses a radiation-sensitive composition that is sensitive to both ultraviolet and infrared radiation. The composition comprises (1) a resole resin, (2) a novolac resin, (3) a latent Brönsted acid and (4) an infrared absorber. The solubility of the composition in an alkaline developer is both reduced in exposed areas and increased in unexposed areas by the steps of imagewise exposure to activating radiation and heating.

Latent Brönsted acids are precursors that form a Brönsted acid by thermally or photochemically initiated decomposition. The Brönsted acid is believed to catalyze a matrix-forming reaction between the resole resin and the novolac resin. Latent Brönsted acids include, for example, onium salts in which the onium cation is iodonium, sulphonium, phosphonium, oxysulphoxonium, oxysulphonium, sulphoxonium, ammonium, diazonium, selononium, or arsonium, and the anion is a non-nucleophilic anion selected from tetra-fluoroborate, hexafluorophosphate, hexafluoroarsenate, hexafluoroantimonate, triflate, tetrakis (pentafluoro-phenyl)borate, pentafluoroethyl sulfonate, p-methyl-benzyl sulfonate, ethyl sulfonate, trifluoromethyl acetate, and pentafluoroethyl acetate. Typical latent Brönsted acids include, for example, diphenyliodonium hexafluorophosphate, diphenyl iodonium hexafluoroantimonate, bis-4-do-decylphenyliodonium hexafluoro antimonate, dicumyliodonium hexofluorophosphate, and triphenylsulfonium hexafluoroantimonate. Non-ionic latent Brönsted acids include, for example, haloalkyl-substituted s-triazines, which are described, for example, in Smith, U.S. Pat. No. 3,779,778.

Nguyen discloses radiation-sensitive compositions imageable by infrared and ultraviolet/visible radiation. These compositions comprise a thermal-activated acid generator; a crosslinking resin; a binder resin comprising a polymer containing reactive pendant groups selected from hydroxy, carboxylic acid, sulfonamide, and alkoxymethylamides; an infrared absorber; and optionally an ultraviolet/visible radiation-activated acid generator for ultraviolet/visible sensitization. The thermal-activated acid generators are typically the same as the latent Brönsted acids described above.

Conventional additives, such as dyes, pigments, plasticizers, sensitizers, stabilizers, surfactants, and components, such as leucodyes, that produce print-out images can be included in these negative-working, alkaline developable compositions.

Imaging and Processing

Imaging may be carried out by well-known methods. When the element is "positive working," the exposed regions are removed to reveal the underlying hydrophilic surface of the substrate. When the element is "negative working," the unexposed regions are removed to reveal the underlying hydrophilic surface of the substrate.

If the element is a photoimageable element, it may be exposed to actinic radiation from a source of light that is absorbed by the photoreactive component or components present. Conventional exposure sources include, for example, carbon arc lamps, mercury lamps, xenon lamps, tungsten lamps, metal halide lamps, and lasers emitting at the appropriate wavelength. Diazonaphthoquinone compounds substituted in the 5-position typically absorb at 345 nm and 400 nm. Diazonaphthoquinone compounds substituted in the 4-position typically absorb at 310 nm and 380 nm. Imagewise exposure is typically carried out through a photomask, but direct digital exposure with a laser emitting at the appropriate wavelength is also possible.

If the element is a thermally imageable element, it may be imaged with a laser or an array of lasers emitting modulated near infrared or infrared radiation in a wavelength region that is absorbed by the element. Infrared radiation, especially infrared radiation in the range of about 800 nm to about 1200 nm, is typically used for imaging a thermally imageable element. Imaging is conveniently carried out with a laser emitting at about 830 nm or at about 1056 nm. Suitable commercially available imaging devices include image setters such as a Creo Trendsetter (CREO, British Columbia, Canada) and a Gerber Crescent 42T (Gerber).

Alternatively, the thermally imageable element may be imaged using a conventional apparatus containing a thermal printing head. An imaging apparatus suitable for use in conjunction with the imageable elements includes at least one thermal head but would usually include a thermal head array, such as a TDK Model No. LV5416 used in thermal fax machines and sublimation printers. When exposure is carried out with a thermal head, it is unnecessary that the element absorb infrared radiation. However, elements that absorb infrared radiation can be imaged with a thermal head.

Imaging produces an imaged element, which comprise a latent image of imaged and unimaged regions. Developing the imaged element to form a developed element converts the latent image to an image by removing the exposed, or imaged, regions and revealing the hydrophilic surface of the underlying substrate.

Typically, the developer is applied to the imaged element by rubbing or wiping the imageable layer with an applicator containing the developer. Alternatively, the imaged element may be brushed with the developer or the developer may be applied to the element by spraying the imageable layer with sufficient force to remove the exposed regions. In either instance, a developed element is produced. Development may be carried out in a commercially available processor, such as a Mercury Processor (Kodak Polychrome Graphics). The Mercury Processor is equipped with an immersion type developing bath, a section for rinsing with water, a gumming section, and a drying section. Additional, a conductivity-measuring unit can be incorporated into the processor.

Development of both positive-working and negative-working imaged elements is typically carried out at a temperature of from about 18° C. to about 28° C., for a period of from about 5 seconds to about 60 seconds.

After a certain number of imaged elements have been developed, the conductivity value falls below a predetermined level. Then the replenisher is added to the processor section that contains the developer. Usually about 30 mL to about 100 mL, typically about 50–80 mL, of replenisher per 1 $m^2$ of imaged element processed is necessary to keep both the volume of developer and its conductivity value constant.

The developed element, typically a lithographic printing member or a printing plate, comprises regions in which imageable layer has been removed revealing the underlying surface of the hydrophilic substrate, and complimentary regions in which the imageable has not been removed. The regions in which the imageable layer has not been removed are ink receptive and correspond to the regions that were not exposed during imaging.

Following development, the developed element is rinsed with water and dried. Drying may be conveniently carried out by infrared radiators.

After drying, the developed element is treated with a gumming solution. A gumming solution comprises one or more water soluble polymers, for example polyvinylalcohol, poly(meth)acrylic acid, poly(meth)acrylamide, polyhydroxyethyl(meth)acrylate, polyvinylmethylether, gelatin, and polysaccharide such as dextran, pullulan, cellulose, gum arabic, and alginic acid. A preferred material is gum arabic.

A developed and gummed plate can also be baked to increase the run length of the plate. Baking can be carried out, for example at about 220° C. to about 240° C. for about 7 to 10 minutes, or at a temperature of 120° C. for 30 min.

INDUSTRIAL APPLICABILITY

The developing system is especially suitable for developing imageable elements useful as positive-working lithographic printing plates. It is especially suited for use with elements in which (1) the imageable layer comprises at least one phenolic resin that is insoluble in water and removable by the aqueous alkaline developer and/or at least one polymeric compound having pendent sulfonamide groups that is insoluble in water and removable by the aqueous the aqueous alkaline developer, and (2) the substrate is aluminum or and an aluminum alloy.

In practice not every developer works well with every printing plate, especially with those that have different interlayers. The attack of a developer on the aluminum substrate depends on the composition of the developer. Therefore, printers who use printing plates with different interlayers must store and use a developer for each type of plate. Because the developer of the invention suppresses attack on aluminum substrates, it can be used with printing plates having a variety of interlayers. Because the developer does not contain a silicate solution (either as metasilicate or an alkali metal water glass), silicate deposits on developed plates are eliminated. Because the conductivity of the developer can be monitored, the invention provides a developing system that makes it relatively easy for an operator to work with a constant activity developer.

The advantageous properties of this invention can be observed by reference to the following examples, which illustrate but do not limit the invention. In the specification, examples, and claims, unless indicated otherwise, all percentages are percentages by weight based on the weight of the developer.

EXAMPLES

| | Glossary |
|---|---|
| REWOTERIC® AM-V | Sodium capryloamphoacetate wetting agent (Witco, Perth Amboy, NJ, USA) |
| SYNPERONIC® T 304 | Poloxamine 304; Polyoxyethylene, polyoxypropylene liquid block copolymer of ethylene diamine (I.C.I. Am., Wilmington, DE, USA) |
| TRILON® B chelating agent | Tetra sodium ethylenediamine tetraacetic acid (BASF, Ludwigshafen, Germany) |

N-Methyl-D-glucamin, meso-inosit (cis-1,2,3,5-trans-4,6-hexahydroxycyclohexane), and L-gulonic acid gamma-lactone were obtained from Aldrich, Milwaukee, Wis., USA.

Preparation of Developers and Replenishers

The following developers and repelenishers were prepared by stirring the components together:

Developer 1—839 g water, 140 g N-methyl-D-glucamin, and 21 g sodium hydroxide.

Developer 2—839 g water, 140 g meso-inosit, and 21 g sodium hydroxide.

Developer 3—84.6 kg water, 14.0 kg meso-inosit, 2.1 kg sodium hydroxide, and 0.24 kg SYNPERONIC® 304 T.

Developer 4—708.5 g water, 140 g L-gulonic acid gamma-lactone, 120 g sodium meta-silicate penta-hydrate, and 31.5 g sodium hydroxide.

Developer 5—81.7 9 water, 15 g, meso-inosit, 2.9 g potassium hydroxide. 0.2 g TRILON® B chelating agent B, and 0.2 g REWOTERIC® AM-V wetting agent.

Replenisher 1—83.3 kg water, 14.0 kg meso-inosit, 3.4 kg sodium hydroxide, and 0.24 kg SYNPERONIC® 304 T.

Preparation of Comparative Developers

Comparative developers 14 were prepared by mixing the components given in Table 1.

TABLE 1

| Component | Compar. Example 1 | Compar. Example 2 | Compar. Example 3 | Compar. Example 4 |
|---|---|---|---|---|
| Water | 979 g | 880 g | 976.6 g | 877.6 g |
| Sodium hydroxide | 21 g | | 21 g | |
| Sodium meta-silicate 5-hydrate | | 120 g | | 120 g |
| SYNPERONIC® 304-T | | | 2.4 g | 2.4 g |

Substrate Attack Test

The weight loss for 1 dm$^2$ aluminum discs having different interlayers but no imageable layer was determined by treating the discs with developer containing different wt % of suppressor. Weight loss was measured by comparing the initial weight of the disc with the weight of the disc after it laid in the developer composition for 5 min at 20° C. Comparative Developers 1 and 2 containing differing amounts of inventive suppressors were evaluated. A developer containing SYNPERONIC® 304-T (Comparative Examples 3 and 4), which is a suppressor for the imageable layer only, was also evaluated. The results are shown in Tables 2 and 3 below.

TABLE 2

Weight loss (in mg) of a 1 dm$^2$ aluminum disc in 2.1 wt % sodium hydroxide

| Wt % suppressor[a] | Untreated substrate | | Phosphate-/ Fluoride Treated Substrate | | Silicate Treated Substrate | | Polyvinyl Phosphonic Acid (PVPA) Treated Substrate | |
|---|---|---|---|---|---|---|---|---|
| None[b] | 5.3 | | 7.3 | | 0.9 | | 10.3 | |
| 3.75 | 5.2 | 4.9 | 7.4 | 7.1 | 0.3 | 0.2 | 10.3 | 10.2 |
| 7.5 | 3.5 | 3.4 | 6.5 | 6.3 | 0.1 | 0.0 | 7.5 | 7.4 |
| 11.25 | 2.1 | 2.2 | 4.9 | 5.0 | 0.0 | 0.0 | 5.8 | 5.7 |
| 15 | 1.2 | 1.3 | 4.2 | 4.0 | 0.0 | 0.0 | 5.0 | 5.0 |
| Comparative Developer 3 | 5.4 | | 7.2 | | 1.0 | | 10.3 | |

[a]The first number is for N-methyl-D-glucamin and the second number is for meso-inosit.
[b]Comparative Developer 1.

TABLE 3

Weight loss (in mg) of a 1 dm² aluminum disc in 12 wt % sodium meta-silicate penta-hydrate

| Wt % supressor[a] | Untreated substrate | | Phosphate/ Fluoride | | Silicate | | PVPA | |
|---|---|---|---|---|---|---|---|---|
| None[b] | 0.9 | | 2.1 | | 0.1 | | 2.0 | |
| 3.75 | 0.8 | 0.7 | 1.9 | 1.8 | 0.1 | 0.0 | 1.9 | 1.8 |
| 7.5 | 0.7 | 0.7 | 1.6 | 1.6 | 0.0 | 0.1 | 1.3 | 1.2 |
| 11.25 | 0.4 | 0.4 | 1.3 | 1.2 | 0.1 | 0.0 | 0.9 | 1.0 |
| 15 | 0.3 | 0.3 | 0.8 | 0.7 | 0.0 | 0.0 | 0.6 | 0.5 |
| Comparative Developer 4[c] | 0.9 | | 2.0 | | 0.1 | | 2.0 | |

[a]The first number is for N-methyl-D-glucamin and the second number is for meso-inosit.
[b]Comparative Developer 2.
[c]Layer suppressor only.

For all substrates there was little or no attack on the aluminum disc when an appropriate concentrations of suppressor was present in the developer. When only SYNPERONIC® 304-T was present, there was attack on all substrates.

Exposure and Developing of the Positive-working Printing Plates

EASYPRINT® and Virage™ positive-working lithographic printing plates (Kodak Polychrome Graphics LLC) were cut into 790 mm×850 mm test samples and exposed with a metal halide lamp (MH-Burner, available from Sack) with 510 mJ/cm² (EASYPRINT®)) and 525 mJ/cm² (Virage™) under a silver halide film half-step wedge (Fogra) with a density range of 0.15 to 1.95 increments as a positive copy.

A commercially available processor (Mercury 850; Kodak Polychrome Graphics LLC), equipped with an immersion type developing bath, a section for rinsing with water, a gumming section, and a drying section, was used to develop the exposed plates. The processor was filled with 60 L of the appropriate developer. If the processor contains more than the given 60 L, the excess is removed via an overflow. This excess can be collected in a container. Separately, a container for the replenisher was attached from which a predetermined amount of replenisher per square meter of exposed plate was added to the developing bath via a pump.

The activity of the developer was examined with the help of its conductivity and by titration of the amount of alkali. The conductivity of the developing bath was monitored by an incorporated SIPAN 3 conductivity measuring unit (Siemens). To determine the alkali content, 10 mL of the developer was removed from the developing bath, 90 mL deionized water was added, and the titration was carried out with 0.5 N HCl (Titrino DMS 716, Metrohm). The number of mL used to reach the first equivalence point is referred to as alkali value.

The temperature of the developing bath, (23±1)° C., and dwell time in the developer, 25 sec, were kept constant in all tests.

To evaluate the copies obtained after development, the following criteria were examined. (1) Number of steps after gray wedge exposure that do not retain coating after development (in the following referred to as GW—the lower the number the less image attack); (2) Microlines in a test pattern to assess resolution that have not been attacked (in the following referred to as ML—the lower the number the greater the resolution indicating less image attack); and (3) Behavior during the print proof or during restarting of the printing (ink acceptance problems of the image and non-image areas—i.e. "toning").

To obtain the latter test results, the exposed and developed plates were mounted in a sheet-fed offset press and proofed. The image areas accepted ink without any problems and the paper copies did not show any background (referred to as toning) in the non-image areas. After about 2000 copies, the press was stopped for about 45 minutes and then restarted (restarting test). The same results as at the beginning of the printing test were obtained. In particular the non-image areas did not show any toning, which indicates a good protection of the basis material by the developer.

Copying Results

The copying results with EASYPRINT® and Virage™ plates and the developers of the invention are listed in Table 4 below.

TABLE 4

Copying Results

| Parameter | Exam. 1 | Exam. 2 | Exam. 3 | Exam. 4 | Exam. 5 | Compar. Exam. 1 | Compar. Exam. 2 |
|---|---|---|---|---|---|---|---|
| EASYPRINT ® | | | | | | | |
| GW | 3 | 3 | 3 | 3/4 | 3 | 5/6 | 6 |
| ML | 10/12 | 10/12 | 12 | 12/15 | 12 | 20/25 | 20/25 |
| Print | no toning | no toning | no toning | no toning | no toning | toning | toning |
| Virage ® | | | | | | | |
| GW | 3 | 3/4 | 3 | 3/4 | 3/4 | 6 | 6 |
| ML | 12 | 12 | 10/12 | 12 | 12 | 25 | 20/25 |
| Print | no toning | no toning | no toning | no toning | no toning | toning | toning |

Stability and Load Tests of EASYPRINT® Plates

EASYPRINT® plates exposed with the Fogra wedge in the same manner as described above were developed one after another at a rate of 140 plates per day for 25 days (plus 4 weekend interruptions) in the Mercury 850 processor. The quality of the resulting copies was evaluated in terms of the GW and the ML values. The activity of the developer was monitored at a throughput of 4 m²/L by conductivity measurements and by titration with 0.5 N HCl.

The results for developer 3 and the corresponding replenisher 1 are listed in Table 5. Titration and conductivity data show that the activity of the developer can be kept constant during long testing period by the addition of 80 mL/m² of developed plate. This is apparent in the almost constant values for the copy parameters gray scale wedge and microlines after the development of 3500 m² plates in the 60 L of developer in the processor. Throughout the course of the test, 175 L of overflow of used developer was collected which corresponds to a value of 50 mL/m² of developed plate.

During the test period, the developing process was not affected by either the formation of foam or the precipitation of insoluble material on the bottom of the processor. After testing was completed, the processor could be easily cleaned by rinsing with water, and no residue remained.

After a throughput of 20, 40 and 58.3 m²/L, EASYPRINT® plates did not show any irregularities in the printing test. Neither ink acceptance nor toning problems occurred.

elements (measured with the apparatus D 19C/D196 from Gretag/Macbeth).

The tests using developers 3 and 4 provided the following results:
(1) The image areas were not attacked which follows from unchanged optical density of the image areas as compared with the non-treated areas.
(2) The 1 and 2 pixel elements were well reproduced.
(3) The optical density for 50% dot was measured to be OD=50 with developer 3 and OD=49 for developer 4.

For the stability and load test exposed ELECTRA® plates were developed in the manner described above one after another at a rate of 33 plates per day for 30 days (plus 5 weekend interruptions) in the Sprinter processor filled with developer 3. For replenishment the replenisher 1 was used. To determine the alkali content, 10 mL of the developer was

TABLE 5

Data of stability and load test

| Throughput (m²/L) | Microlines | Gray scales | Replenisher (mL/m²) | Titration (mL 0.5 N HCl) | Conductivity (mS/cm) |
|---|---|---|---|---|---|
| 0 | 12 | 3 |  | 10.8 | 58.4 |
| 4 | 12 | 3 | 80 | 10.6 | 58.2 |
| 8 | 12/15 | 3 to 4 | 80 | 10.8 | 58.3 |
| 12 | 12 | 3 | 80 | 10.4 | 57.9 |
| 16 | 12 | 3 to 4 | 80 | 10.5 | 58.1 |
| 20 | 12/15 | 3 | 80 | 10.3 | 57.8 |
| 24 | 12 | 3 | 80 | 10.6 | 58.0 |
| 28 | 12 | 3 | 80 | 10.4 | 58.1 |
| 32 | 12/15 | 3 to 4 | 80 | 10.3 | 57.9 |
| 36 | 12 | 3 | 80 | 10.7 | 57.8 |
| 40 | 12/15 | 3 to 4 | 80 | 10.5 | 58.0 |
| 44 | 12 | 3 | 80 | 10.4 | 57.7 |
| 48 | 12/15 | 3 | 80 | 10.5 | 57.9 |
| 52 | 12/15 | 3 to 4 | 80 | 10.5 | 57.8 |
| 58.3 | 12/15 | 3 to 4 |  | 10.4 | 58.0 |

Developing of Positive-Working Thermal Plate

ELECTRA® positive-working thermal printing plates (Kodak Polychrome Graphics LLC) were cut into 515 mm×790 mm test samples. The test samples were exposed in a Trendsetter 3244 (Creo) infrared exposure unit at an energy of 10 W and a rotional speed of the drum of 180 rpm. The Kodak Professional COLORFLOW® Strip (Eastman Kodak), which contains different elements for evaluating the quality of the copies, was used for evaluation.

A commercially available processor (Sprinter; Kodak Polychrome Graphics LLC), equipped with an immersion type developing bath, a section for rinsing with water, and a gumming and drying section, was used to develop the imagewise exposed plates. The processor was filled with 20 L of the appropriate developer. Separately, a container for the replenisher was attached from which a predetermined amount of replenisher per square meter of exposed plate was added to the developing bath via a pump.

The temperature of the developing bath, (23±1)° C., and the dwell time in the developer, 45 sec, were kept constant in all tests.

The activity of the developer was examined with the help of its conductivity and by titration of the amount of alkali. The conductivity of the developing bath was monitored by a separately mounted conductivity measuring unit (Conductivity Monitor, Unigraph). To evaluate the copies obtained after development, the following criteria were examined: reproduction of the 1 and 2 pixel elements, optical density (OD) of the checkerboard dots of the pixel removed from the developing bath, 90 mL deionized water was added, and titration was carried out with 0.5 N HCl (Titrino DMS 716, Metrohm). The number of mL used to reach the first equivalence point is referred to as alkali value. The quality of the resulting copies was evaluated in terms as above. At a throughput of 2 m²/L the electrical conductivity was measured as well as the developer activity.

Addition of 82 mL of replenisher kept the activity of the developer constant until the end of testing of 15 m²/L (electrical conductivity: 58.4 mS/cm; titration: 10.8 mL). The copy parameters of OD (optical density)=94 for 95% dot screen and OD=50 for 50% dot screen in the beginning only slightly changed to OD=95 and OD=51, respectively, at the end of the test. The reproduction of the 1 and 2 pixel elements did not change.

Plates developed with this developing system showed no problems in ink acceptance or toning during the printing test at the print proof and upon restart.

When positive-working thermal printing plate exposed as above were developed with the Comparative Developers 1 to 4, both the 1 and 2 pixel elements were not reproduced by the plates. With Comparative Examples 1 and 2, the 50% dots were also removed. In Comparative Examples 3 and 4, the 50% dots were highly attacked.

The invention has been described in detail, with particular reference to certain preferred embodiments thereof, but it should be understood that variations and modifications may be effected within the spirit and scope of the invention.

Having described the invention, we now claim the following and their equivalents.

What is claimed is:

1. An aqueous alkaline developer comprising an aqueous solution of meso-inosit, in which:
   the meso-inosit comprises about 10 wt % to about 30 wt % of the developer;
   the developer has a pH between about 12 and about 13.5; and
   the developer has a conductivity of about 40 to about 80 mS/cm.

2. The developer of claim 1 in which the developer does not comprise a silicate.

3. The developer of claim 1 in which the developer additionally comprises at least one additive selected from the group consisting of surfactants, biocides, antifoaming agents, and chelating agents.

4. The developer of claim 1 in which the developer additionally comprises a total of about 0.0005 wt % to about 3 wt % of one or more polyglycol derivatives selected from the group consisting of:
   polycondensation products of $C_2$–$C_4$ alkylene oxides with ethylene diamine, and polyglycol derivatives having the structure:

in which $R^6$ is hydrogen or $C_1$–$C_8$ alkyl; $R^7$ is hydrogen, methyl or ethyl; $R^8$ is hydrogen or $CH_2COOH$; and y is about 10 to about 20.

5. The developer of claim 4 in which the developer additionally comprises a salt of ethylenediamine tetraacetic acid.

6. The developer of claim 4 in which the polyglycol derivative. is selected from the group consisting of polypropylene glycol ethers, polyethylene glycol ethers, polybutylene glycol ethers, and mixtures thereof.

7. The developer of claim 4 in which the polyglycol derivative has the structure:

in which $R^6$ is hydrogen or $C_1$–$C_8$ alkyl; $R^7$ is hydrogen, methyl or ethyl; $R^8$ is hydrogen or $CH_2COOH$; and y is an integer from 10 to 20.

8. The developer of claim 4 in which the polyglycol derivative is the polycondensation product of $C_2$–$C_4$ alkylene oxides with ethylene diamine.

9. The developer of claim 8 in which the developer additionally comprises a salt of ethylenediamine tetraacetic acid.

10. An aqueous alkaline developer comprising an aqueous solution of one or more water-soluble suppressors of the following structure:

in which n is 4 to 7; and
    either (i) $R_1$ is hydrogen, aryl, or $CH_2OH$; and $R_2$ is alkyl group having 1 to 4 carbon atoms, $CH_2OR_3$ in which $R_3$ is an alkyl group having 1 to 4 carbon atoms, $CH_2N(R_4R_5)$ in which $R_4$ and $R_5$ are each independently hydrogen or an alkyl group having 1 to 4 carbon atoms, or $CO_2H$; or (ii) $R_1$ and $R_2$ together form a carbon-carbon single bond;
    in which:
    the developer has a pH of about 10.0 to about 14;
    the one or more suppressors together comprise about 10 wt % to about 30 wt % of the developer; and
    the developer additionally comprises:
    a total of about 0.0005 wt % to about 3 wt % of one or more polyglycol derivatives selected from the group consisting of:
    polycondensation products of $C_2$–$C_4$ alkylene oxides with ethylene diamine, and polyglycol derivatives having the structure:

in which $R^6$ is hydrogen or $C_1$–$C_8$ alkyl; $R^7$ is hydrogen, methyl or ethyl; $R^8$ is hydrogen or $CH_2COOH$; and y is about 10 to about 20.

11. The developer of claim 10 in which the developer has a pH between about 12 and about 13.5.

12. The developer of claim 11 in which the developer has a conductivity of about 40 to about 80 mS/cm.

13. The developer of claim 12 in which $R^1$ and $R^2$ together form a carbon-carbon single bond, and n is 5 or 6.

14. The developer of claim 12 in which $R^1$ is H, $R^2$ is $CO_2H$, and n is 4 or 5.

15. The developer of claim 14 in which the suppressor is selected from the group consisting of ribonic acid, gluconic acid, mannonic acid, and gulonic acid.

16. The developer of claim 12 which $R^1$ is hydrogen, $R^2$ is $CH_2N(R^4R^5)$, and $R^4$ and $R^5$ are each independently hydrogen or an alkyl group having 1 to 2 carbon atoms.

17. The developer of claim 16 in the suppressor is glucamine, N-methyl-glucamine, or 1-desoxy-1-(methylamino)-D-galactit.

18. The developer of claim 12 in which the developer does not comprise a silicate.

19. The developer of claim 10 in which (i) $R^1$ and $R^2$ together form a carbon-carbon single bond, and n is 5 or 6; (ii) $R^1$ is H, $R^2$ is $CO_2H$, and n is 4 or 5; or (iii) $R^1$ is hydrogen, $R^2$ is $CH_2N(R^4R^5)$, and $R^4$ and $R^5$ are each independently hydrogen or an alkyl group having 1 to 2 carbon atoms.

20. The developer of claim 10 in which the suppressor is selected from the group consisting of meso-inosit, ribonic acid, gluconic acid, mannonic acid, gulonic acid, glucamine, N-methyl-glucamine, and 1-desoxy-1-(methylamino)-D-galactit.

21. The developer of claim 10 in which the developer additionally comprises at least one additive selected from the group consisting of surfactants, biocides, antifoaming agents, and chelating agents.

22. The developer of claim 10 in which the developer additionally comprises a salt of ethylenediamine tetraacetic acid.

23. The developer of claim 10 in which the polyglycol derivative is selected from the group consisting of polypropylene glycol ethers, polyethylene glycol ethers, polybutylene glycol ethers, and mixtures thereof.

24. The developer of claim 23 in which the developer additionally comprises at least one additive selected from the group consisting of surfactants, biocides, antifoaming agents, and chelating agents.

25. The developer of claim 23 in which the developer has a pH between about 12 and about 13.5; and the developer has a conductivity of about 40 to about 80 mS/cm.

26. The developer of claim 25 in which the developer additionally comprises a salt of ethylenediamine tetraacetic acid.

27. The developer of claim 16 in which the polyglycol derivative has the structure:

in which $R^6$ is hydrogen or $C_1$–$C_8$ alkyl; $R^7$ is hydrogen, methyl or ethyl; $R^8$ is hydrogen or $CH_2COOH$; and y is an integer from 10 to 20.

28. The developer of claim 27 in which the developer additionally comprises at least one additive selected from the group consisting of surfactants, biocides, antifoaming agents, and chelating agents.

29. The developer of claim 27 in which the developer has a pH between about 12 and about 13.5; and the developer has a conductivity of about 40 to about 80 mS/cm.

30. The developer of claim 29 in which the developer additionally comprises a salt of ethylenediamine tetraacetic acid.

31. The developer of claim 10 in which the polyglycol derivative is the polycondensation product of $C_2$–$C_4$ alkylene oxides with ethylene diamine.

32. The developer of claim 31 in which the developer additionally comprises at least one additive selected from the group consisting of surfactants, biocides, antifoaming agents, and chelating agents.

33. The developer of claim 31 in which the developer has a pH between about 12 and about 13.5; and the developer has a conductivity of about 40 to about 80 mS/cm.

34. The developer of claim 33 in which the developer additionally comprises a salt of ethylenediamine tetraacetic acid.

* * * * *

UNITED STATES PATENT AND TRADEMARK OFFICE
CERTIFICATE OF CORRECTION

PATENT NO.     : 6,541,188 B2
DATED          : April 1, 2003
INVENTOR(S)    : Fiebag et al.

It is certified that error appears in the above-identified patent and that said Letters Patent is hereby corrected as shown below:

Column 18,
Line 28, after "claim 12" and before the word "which" insert the word -- in --
Line 31, after the word "in" and before the word "the" insert the word -- which --

Column 19,
Line 4, delete "claim 16" and insert therefore -- claim 10 --

Signed and Sealed this

Fifth Day of August, 2003

JAMES E. ROGAN
*Director of the United States Patent and Trademark Office*